United States Patent
Aizawa

(10) Patent No.: US 8,259,853 B2
(45) Date of Patent: Sep. 4, 2012

(54) DIGITAL BROADCAST RECEIVING DEVICE

(75) Inventor: Masami Aizawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 848 days.

(21) Appl. No.: 12/174,916

(22) Filed: Jul. 17, 2008

(65) Prior Publication Data

US 2009/0022249 A1  Jan. 22, 2009

(30) Foreign Application Priority Data

Jul. 19, 2007 (JP) .................................. 2007-188688

(51) Int. Cl.
*H03K 9/00* (2006.01)
*H04L 27/00* (2006.01)

(52) U.S. Cl. ......................................... 375/316

(58) Field of Classification Search ................... 375/316
See application file for complete search history.

(56) References Cited

U.S. PATENT DOCUMENTS 6,621,792 B1 * 9/2003 Petty ........................... 370/230.1
6,754,503 B1 * 6/2004 Aldaz et al. ................... 455/504

FOREIGN PATENT DOCUMENTS

JP  2005-286504  10/2005
JP  2005286504 A * 10/2005

* cited by examiner

*Primary Examiner* — David C. Payne
*Assistant Examiner* — Tanmay Shah
(74) *Attorney, Agent, or Firm* — Turocy & Watson, LLP

(57) ABSTRACT

A receiving apparatus includes a demodulation means for demodulating a transmission signal to output a demodulation output having a predetermined number of bits; a reliability calculation means for calculating reliability of the transmission signal to output reliability information; a conversion processing means for reducing the number of bits of the demodulation output on the basis of the reliability information, and for multiplexing the demodulation output having the reduced number of bits and the reliability information to output the multiplexed result; and a deinterleave means for deinterleaving the output of the conversion processing means.

7 Claims, 4 Drawing Sheets

11: TUNER
12: A/D CONVERTER
13: QUADRATURE DETECTION CIRCUIT
14: FFT CIRCUIT
15: DEMODULATION CIRCUIT
16: RELIABILITY DETERMINATION CIRCUIT
17: CONVERSION PROCESSING CIRCUIT
18: DEINTERLEAVE CIRCUIT
19: CONVERSION DECODING CIRCUIT
20: ERROR CORRECTION CIRCUIT
21: TRANSMISSION PATH ESTIMATION CIRCUIT

11: TUNER
12: A/D CONVERTER
13: QUADRATURE DETECTION CIRCUIT
14: FFT CIRCUIT
15: DEMODULATION CIRCUIT
16: RELIABILITY DETERMINATION CIRCUIT
17: CONVERSION PROCESSING CIRCUIT
18: DEINTERLEAVE CIRCUIT
19: CONVERSION DECODING CIRCUIT
20: ERROR CORRECTION CIRCUIT

11: TUNER
12: A/D CONVERTER
13: QUADRATURE DETECTION CIRCUIT
14: FFT CIRCUIT
15: DEMODULATION CIRCUIT
16: RELIABILITY DETERMINATION CIRCUIT
17: CONVERSION PROCESSING CIRCUIT
18: DEINTERLEAVE CIRCUIT
19: CONVERSION DECODING CIRCUIT
20: ERROR CORRECTION CIRCUIT
21: TRANSMISSION PATH ESTIMATION CIRCUIT

DIGITAL BROADCAST RECEIVING DEVICE

CROSS-REFERENCE TO RELATED APPLICATIONS

This application is based upon and claims the benefit of priority from the prior Japanese Patent Application No. 2007-188688, filed Jul. 19, 2008, the entire contents of which are incorporated herein by reference.

BACKGROUND OF THE INVENTION

1. Field of the Invention

The present invention relates to a receiving apparatus suitable for one that receives a digital broadcast signal subjected to interleaving.

2. Description of the Related Art

In recent years, the digital broadcast that performs transmission and reception in a digital system has been started. In the digital broadcast in Japan, an ISDB-T system is employed. In the ISDB-T system, a TS (transport stream) defined in the MPEG (Moving Picture Expert Group)-2 standard is subjected to signal processing such as error correction coding, interleave coding, digital modulation, and the like. Further, the TS is OFDM (Orthogonal Frequency Division Multiplexing) modulated and the modulated result is outputted.

Moreover, in the terrestrial digital broadcast, interleaving over relatively long time periods is employed. Noise is dispersed by interleaving to facilitate error correction, thus making it easy to achieve a decodable state even if a poor reception state occurs due to amplitude fluctuation by fading.

A large capacity is required for a memory for interleaving used in the terrestrial digital broadcast in which the number of pixels is large. To this end, Japanese Patent Laid-Open No. 2005-286504 (hereinafter referred to as Patent Document 1) discloses the technique for reducing a capacity of the memory for interleaving. In the proposal in Patent Document 1, in order to reduce the capacity of the memory for interleaving, information is compressed by pre-demapping before deinterleaving so as to reduce the number of bits.

However, there is need to specify a modulation scheme in order to perform pre-demapping. The modulation scheme can be grasped from transmission data after deinterleaving. However, in the case where a plurality of hierarchies is spread by interleaving as in the transmission system in Japan, a circuit for determining a modulation scheme must be prepared separately in order to specify the modulation scheme before deinterleaving.

Moreover, reliability information of transmission data is generally used in error correction processing. A general error correction code has correlation in time between signals. By use of reliability of information, weighting of error correction due to an error correction code with low reliability is reduced, allowing improvement in error correction accuracy.

However, in the technique disclosed in Patent Document 1, the reliability information calculated from a transfer function or the like and soft-decision information are combined to execute bit reduction due to pre-demapping. This makes it impossible to separate the reliability information and the soft-decision information from each other after interleaving, with the result that the reliability information cannot be used in error correction processing.

SUMMARY OF THE INVENTION

A receiving apparatus according to one aspect of the present invention includes a demodulation means for demodulating a transmission signal to output a demodulation output having a predetermined number of bits; a reliability calculation means for calculating reliability of the transmission signal to output reliability information; a conversion processing means for reducing the number of bits of the demodulation output on the basis of the reliability information, and for multiplexing the demodulation output having the reduced number of bits and the reliability information to output the multiplexed result; and a deinterleave means for deinterleaving an output of the conversion processing means.

DETAILED DESCRIPTION OF THE INVENTION

First Embodiment

Figure 1:
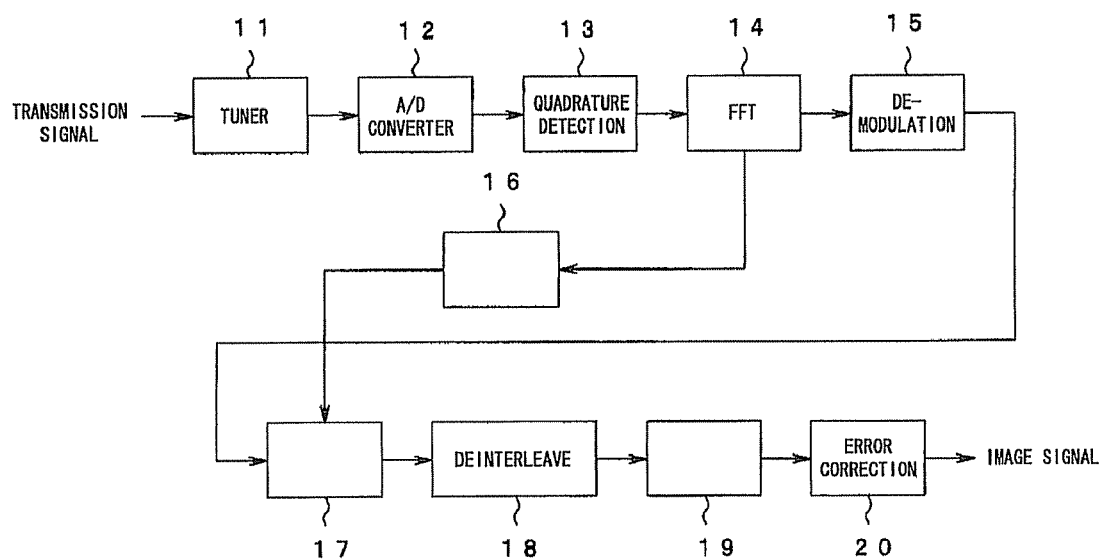
FIG. 1 is a block diagram showing a receiving apparatus according to a first embodiment of the present invention.

The following will specifically explain embodiments of the present invention with reference to the drawings. FIG. 1 is a block diagram showing a receiving apparatus according to a first embodiment of the present invention.

In FIG. 1, a transmission signal is inputted to a tuner 11 of a receiving apparatus 10. The transmission signal is obtained by quadrature-modulating an OFDM signal. The tuner 11 selects a signal of a predetermined band from the inputted transmission signals and outputs the selected signal to an A/D converter 12. The A/D converter 12 converts the inputted signal into a digital signal and outputs the resultant signal to a quadrature detection circuit 13. The quadrature detection circuit 13 performs quadrature detection processing on the inputted digital signal to obtain a baseband OFDM signal.

The baseband OFDM signal from the quadrature detection circuit 13 is supplied to an FFT circuit 14. The FFT circuit 14 removes a guard interval from the baseband OFDM signal and performs FFT (Fast-Fourier Transform) to transform an OFDM signal of a time region into an OFDM symbol of a frequency region. The OFDM symbol is supplied to a demodulation circuit 15.

The OFDM signal is subjected to signal processing such as error correction coding, interleave coding, digital modulation, and the like on a transmission side. The demodulation circuit 15 demodulates the inputted OFDM symbol to restore data before modulation. For example, each subcarrier of the OFDM symbol is modulated by a modulation scheme such as PSK modulation or QAM modulation, and the demodulation circuit 15 restores data before modulation by demodulation corresponding to these modulation schemes.

In this embodiment, an output of the demodulation circuit 15 is supplied to a deinterleave circuit 18 through a conversion processing circuit 17. Moreover, an output of the deinterleave circuit 18 is supplied to an error correction circuit 20 through a conversion decoding circuit 19. The deinterleave circuit 18 performs deinterleaving to restore data before interleave coding. The error correction circuit 20 performs error correction using an error correction code to correct an error of data, and outputs the corrected data.

In this embodiment, the number of bits of the output of the demodulation circuit 15 is reduced by the conversion processing circuit 17 in order to decrease a memory capacity necessary for the deinterleave circuit 18. Then, the number of bits of the output after deinterleaving is returned to the original number of bits by the conversion decoding circuit 19 and the resultant bits are supplied to the error correction circuit 20.

Information of reliability representing degree of reliability is inputted to the conversion processing circuit 17 from a reliability determination circuit 16. The reliability determination circuit 16 obtains the reliability of transmission data using the known means for obtaining reliability information. For example, the reliability determination circuit 16 may obtain the reliability information using an S/N of an output of the FFT circuit 14, and data after interpolation of a pilot signal may be used as the reliability information. Moreover, though the reliability determination circuit 16 obtains the reliability information from the output of the FFT circuit 14 in FIG. 1, the reliability information may be obtained from the output of the demodulation circuit 15.

The conversion processing circuit 17 reduces the number of bits of the demodulation output from the demodulation circuit 15 on the basis of the reliability information. Namely, the conversion processing circuit 17 performs conversion of the demodulation output so that the lower the reliability information is, the smaller the number of bits of the demodulation output becomes.

In the case of the transmission signal of ISDB-T system, the demodulation circuit 15 performs demapping using signals of I and Q axes (I signal, Q signal) for specifying symbols arranged at the respective lattice coordinate points on I-Q plane. In general, the number of bits, which is larger than the minimum number of bits necessary to specify the respective symbol points, is allocated to I and Q signals. This embodiment uses a soft decision in which symbol points are decided according to the values of I and Q signals instead of a hard decision in which the values of the I and Q signals are forcibly allocated to the closest symbol points. Namely, the demodulation outputs in this embodiment are soft decision signals, which are I and Q signals, and include information of the closest symbol point on a constellation obtained by the I and Q signals and a distance from the symbol point. The soft decision signal is supplied to the conversion processing circuit 17.

By the way, the error correction code has a correlation property between the signals. In other words, the error correction circuit 20 performs error correction based on the correlation between the distance from the symbol point and a front or back signal. In this case, when the reliability is low as a result of the soft decision, for example, when an S/N becomes worse, it is possible to improve accuracy in error correction by reducing weighting when the reliability of the soft decision signal is low. Namely, in the error correction circuit 20, weighting of the soft decision signal is reduced to prevent information having low reliability from being used in error correction, thereby reducing an adverse influence of the soft decision signal having low reliability.

In the error correction, the soft decision signals having correlation are weighted according to the reliability information, so that an influence on the other soft decision signal is limited. That is, in the error correction with consideration given to the reliability, processing is performed so that a quantization level of the soft decision signal having low reliability is lowered and the amount of information is reduced.

Accordingly, even if the amount of information is reduced according to the reliability before the error correction, it can be considered that little adverse influence is exerted on error correction capability.

Accordingly, in this embodiment, the conversion processing circuit 17 performs conversion into a converted soft-decision signal, whose number of bits is reduced according to the reliability information, before deinterleaving, thereby reducing the memory capacity necessary for the deinterleave circuit 18.

Figure 2:
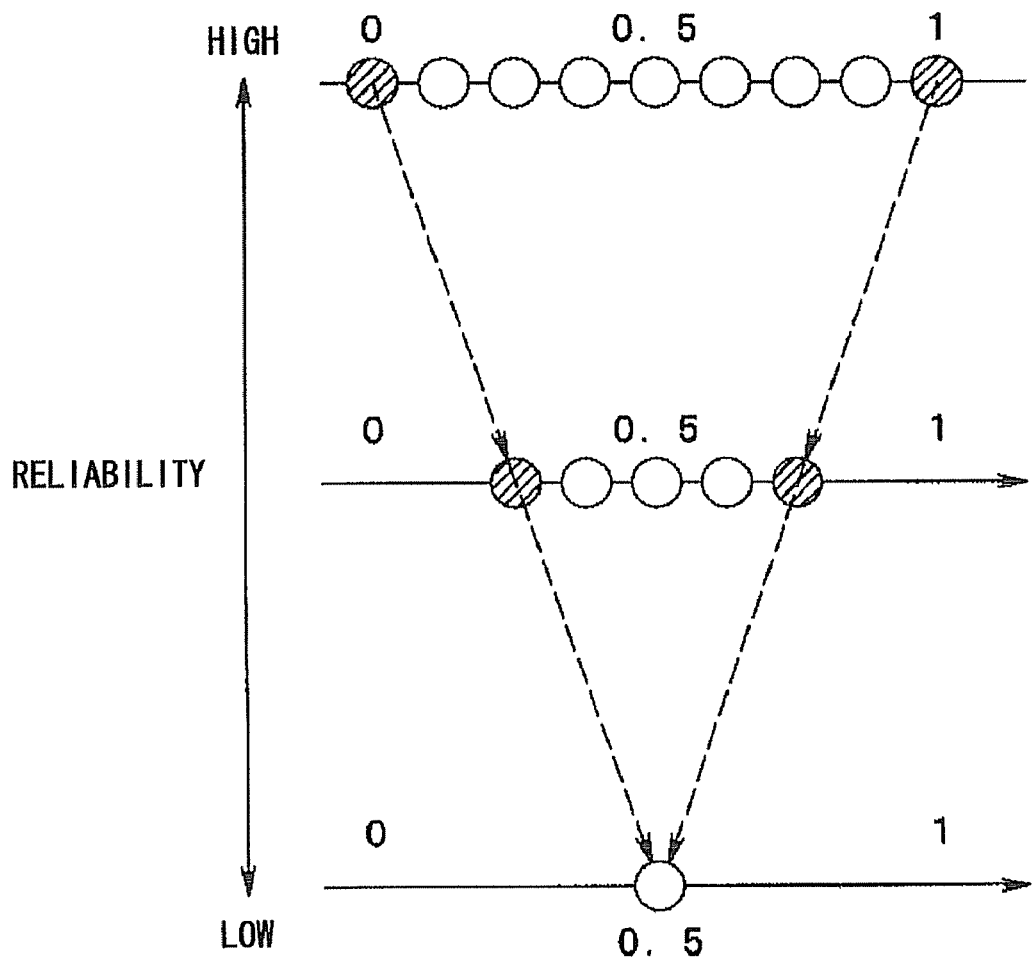
FIG. 2 is an explanatory view explaining conversion processing by a conversion processing circuit 17 in FIG. 1.
Figure 3:
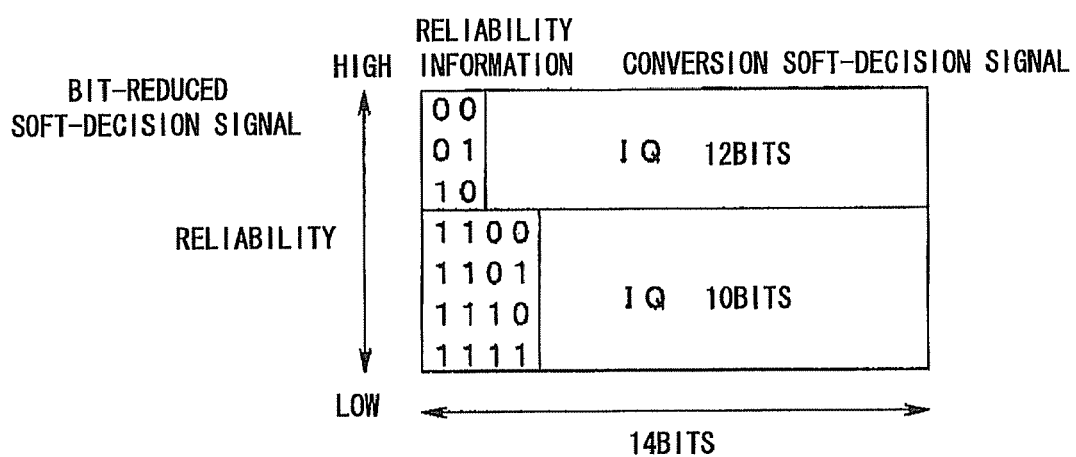
FIG. 3 is an explanatory view explaining conversion processing by a conversion processing circuit 17 in FIG. 1.

FIGS. 2 and 3 are explanatory views each explaining conversion processing by the conversion processing circuit 17 in FIG. 1. In FIG. 2, each of hatched circles shows a value of hard decision, namely, symbol. Each white circle represents a value of soft decision between two symbols. Namely, FIG. 2 shows a distance between two symbols where one symbol position is a reference "0" and other symbol position is "1." The uppermost stage in FIG. 2 shows an example in which a distance between two symbols is divided into eight levels by white circles and the distance between the symbols is expressed by three bits. To simplify the explanation, FIG. 2 shows an example of conversion into data having the number of bits of three types according to the reliability, but types of bit numbers and the number of bits can be optimally set. The uppermost stage in FIG. 2 shows a converted soft-decision signal when the reliability is the highest, and the lower stage shows a converted soft-decision signal in which the lower the reliability is, the larger the number of reducing bits becomes.

In the conversation processing circuit 17, it is now assumed that conversion into the converted soft-decision signal according to the reliability in connection with the number of bits of three types shown in upper, intermediate and lower stages in FIG. 2. Now assuming that the reliability of a soft-decision signal inputted to the conversion processing circuit 17 shows a sufficiently high value based on the reliability information from the reliability determination circuit 16. In this case, the conversion processing circuit 17 performs conversion into a converted soft-decision signal capable of expressing white circle positions in the upper stage in FIG. 2 that shows the distance between two symbols by resolution of eight levels, for example.

Also, assuming that the reliability of a soft-decision signal inputted to the conversion processing circuit 17 shows an intermediate reliability value based on the reliability information from the reliability determination circuit 16. In this case, the conversion processing circuit 17 performs conversion into a converted soft-decision signal capable of expressing white circle positions in the intermediate stage in FIG. 2 that shows the distance between two symbols by resolution of four levels, for example. Namely, in this case, the distance between two symbols can be expressed by two bits.

Further, assuming that the reliability of a soft-decision signal inputted to the conversion processing circuit 17 shows the lowest value on the basis of the reliability information from the reliability determination circuit 16. In this case, the conversion processing circuit 17 performs conversion into a converted soft-decision signal capable of expressing a white circle position in the lower stage in FIG. 2 that shows that the distance between two symbols corresponds to an intermediate value of the symbols, for example. Namely, in this case, the distance between two symbols can be expressed by one or zero bit.

Thus, the conversion processing circuit 17 changes the quantization level of the soft-decision signal according to the reliability. In other words, the conversion processing circuit 17 performs processing so that the higher the reliability is, the more finely the quantization level is set, and the lower the reliability is, the more roughly the quantization level is set. Accordingly, the converted soft-decision signal converted by the conversion processing circuit 17 comes close to the intermediate value between two symbols when the reliability is low.

Thus, in this embodiment, the conversion processing circuit 17 generates a converted soft-decision signal in which the number of bits of the soft-decision signal is reduced when the reliability is low. This enables a reduction in memory capacity to be used in deinterleaving of the deinterleave circuit 18 as described later.

However, in consideration of actual hardware mounting, when information with high reliability is continued, the number of bits of the soft-decision signal cannot be reduced. For this reason, the reliability information is converted into a variable length code, thereby making it possible to reduce the number of bits. Namely, the conversion processing circuit 17 expresses the reliability information by a small number of bits when the reliability is high, and expresses it by a large number of bits when the reliability is low. This makes it possible to maintain the total number of bits of the converted soft-decision signal and the reliability information constant.

FIG. 3 shows an example of a converted soft-decision signal converted by the conversion processing circuit 17 according to the reliability information. The conversion processing circuit 17 adds the reliability information to the converted soft-decision signal to thereby obtain a bit-reduced soft-decision signal. In this case, regarding the reliability information to be added, the conversion processing circuit 17 allocates a small number of bits when the reliability is high and allocates a large number of bits when the reliability is low.

Unlike the example in FIG. 2, FIG. 3 shows an example of conversion into converted soft-decision signals of seven types according to the reliability and specifically a case in which each of soft-decision signals having 12 bits is inputted from the demodulation circuit 15 and each of the reliability information having four bits is inputted from the reliability determination circuit 16. Each of three converted soft-decision signals having high reliability is composed of 12 bits, which is the same as that of the input soft-decision signal, and two-bit reliability information (00, 01, or 10) is added thereto according to the reliability. Further, each of four converted soft-decision signals having low reliability is composed of 10 bits, and four-bit reliability information (1100, 1101, 1110, or 1111) is added thereto according to the reliability. Thus, FIG. 3 shows an example in which a 16-bit soft-decision signal is converted into a bit-reduced soft-decision signal having 14 bits.

In the example in FIG. 3, a sum of the number of bits of the converted soft-decision signal and the reliability information that form the bit-reduced soft-decision signal is constant (14 bits) regardless of the reliability. By this means, in the example in FIG. 3, it is possible to make constant an amount of signals regardless of reception quality and facilitate memory allocation.

In addition, the number of bits of the bit-reduced soft-decision signal does not have to be constant. Moreover, the number of allocation bits in FIG. 3 is one example. Further, in the example in FIG. 3, the number of bits of two types is used as the converted soft-decision signal, but the number of bits of the converted soft-decision signal may be stepwise changed for each reliability level.

The bit-reduced soft-decision signals from the conversion processing circuit 17 are supplied to the deinterleave circuit 18. The deinterleave circuit 18 has a memory, which is not illustrated, and stores a bit-reduced soft-decision signal for each carrier, and rearranges the bit-reduced soft-decision signals stored in the memory to return the arrangement order thereof to an original arrangement order by deinterleaving corresponding to interleaving.

The bit-reduced soft-decision signals returned to the original arrangement order by the deinterleave circuit 18 are supplied to the conversion decoding circuit 19. The conversion decoding circuit 19 returns the bit-reduced soft-decision signals to the original soft-decision signals based on the added reliability information. In the conversion processing circuit 17, when conversion into a rough quantization level signal is performed, part of the original information is lost according to the quantization level. For example, when conversion into the converted soft-decision signal shown in the lower stage in FIG. 2 is performed even if the original soft-decision signal has a value representing a position other than the symbol position (any value which is larger than 0 and smaller than 1), the value of soft-decision is fixed to 0.5 as it is by returning the bit-reduced soft-decision signal to the original soft-decision signal by demodulation. Thus, the conversion decoding circuit 19 converts the bit-reduced soft-decision signal into the soft-decision signal having the original number of bits, and outputs the resultant signal to the error correction circuit 20.

The error correction circuit 20 performs error correction of the input soft-decision signal. Namely, the error correction circuit 20 performs decoding for intra coding and outer coding corresponding to error correction carried out on the transmission side. In addition, convolutional coding, RS coding and the like are used as intra coding and outer coding. It should be noted that the aforementioned coding has been shown by way of example, but the present invention is not limited to this.

In this case, the error correction circuit 20 performs weighting using the reliability information. Namely, the value of the soft-decision signal having low reliability is made closer to the intermediate value. In other words, the error correction circuit 20 reduces weighting on the soft-decision signal when the reliability of the soft-decision signal is low. For example, the error correction circuit 20 performs loss correction of weighting 0 when the reliability is the lowest. By this means, it is possible to remove an adverse effect that the soft-decision signal has on other soft-decision signals. In other words, weighting in the error correction circuit 20 is equivalent to processing for making the value come close to the intermediate value between the symbols when the reliability of the soft-decision signal is low in the conversion processing circuit 17.

Accordingly, even if information is lost by setting the quantization level roughly in the conversion processing circuit 17, it can be considered that lost information is information that is not used in error correction in the error correction circuit 20. Accordingly, even if the bit reduction is performed by the conversion processing circuit 17, correction accuracy of the error correction circuit 20 is not reduced. A signal subjected to error correction, for example, a transport stream is outputted from the error correction circuit 20.

An explanation will be next given of an operation of the above-configured embodiment.

The tuner 11 selects a signal of a predetermined channel from transmission signals. The selected signal is converted into a digital signal by the A/D converter 12, and thereafter the resultant signal is subjected to quadrature detection by the quadrature detection circuit 13. The FFT circuit 14 performs FFT on a quadrature detection output to transform an OFDM signal of a time region into an OFDM symbol of a frequency region.

The OFDM symbol is supplied to the demodulation circuit 15 to be demodulated, and data before demodulation on the transmission side is restored. Moreover, the reliability determination circuit 16 determines the reliability of the transmission signal using the output of the FFT circuit 14, and outputs the reliability information.

The conversion processing circuit 17 receives the soft-decision signal from the demodulation circuit 15 and the reliability information from the reliability determination circuit 16, and converts the soft-decision signal into a converted soft-decision signal based on the reliability information. In the converted soft-decision signal, the lower the reliability is, the rougher the quantization level becomes. Namely, the soft-decision signal is converted into the converted soft-decision signal having a small amount of bits when the reliability is low. The converted soft-decision signal shows a value more intermediate between the symbols when the reliability is low. The conversion processing circuit 17 adds the reliability information, whose code length is short when the reliability is low, to the converted soft-decision signal, and outputs the resultant signal as a bit-reduction soft-decision signal.

The bit-reduced soft-decision signal is supplied to the deinterleave circuit 18. The deinterleave circuit 18 returns the arrangement order of the bit-reduced soft-decision signals to the original arrangement order by deinterleaving corresponding to interleaving on the transmission side. The number of bits of the bit-reduced soft-decision signal is smaller than a sum of the number of bits of the soft-decision signal from the demodulation circuit 15 and the number of bits of the reliability information from the reliability determination circuit 16, and therefore it is possible to reduce the memory capacity necessary for deinterleaving of the deinterleave circuit 18.

The bit-reduced soft-decision signal subjected to deinterleaving is supplied to the conversion decoding circuit 19, and the number of bits is returned to the original number of bits. In this case, the reliability information can be returned to the original information. However, information is lost by processing for reducing the quantization level in the conversion processing circuit 17, and therefore the soft-decision signal cannot be returned to the original soft-decision signal.

The soft-decision signal from the conversion decoding circuit 19 is supplied to the error correction circuit 20. The error correction circuit 20 performs error correction by weighting using the reliability information. Namely, the soft-decision signal is weighted small when the reliability is low. By this means, it is possible to suppress an adverse effect that the soft-decision signal with low reliability has on an error correction of the other soft-decision signals. Loss of information by reducing the quantization level in the conversion processing circuit 17 has the same meaning as loss of information by weighting in the error correction, and correction accuracy in error correction is not reduced by loss of information by the conversion processing circuit 17. An error-corrected transport stream is outputted from the error correction circuit 20.

Thus, in this embodiment, in error correction, regarding information with low reliability, weighting is reduced to suppress an influence of the information with low reliability on the other information, and in consideration of this point, the soft-decision signal obtained by demodulation is subjected to deinterleaving after the number of bits is reduced according to the reliability. This enables to perform deinterleaving with a small amount of memory capacity without decreasing the error correction capability.

FIG. 3 shows an example of conversion into a converted soft-decision signal having the number of bits of two types according to the reliability information. However, it may be possible to perform conversion into a converted soft-decision signal having the number of bits of three or more types.

The first embodiment has shown an example in which the relationship between the reliability and the converted soft-decision signal is uniquely decided. However, a case can be considered in which the relationship between the reliability and the converted soft-decision signal may be changed according to the transmission path condition depending on the condition of the transmission path through which the transmission signal is transmitted.

Second Embodiment

Figure 4:
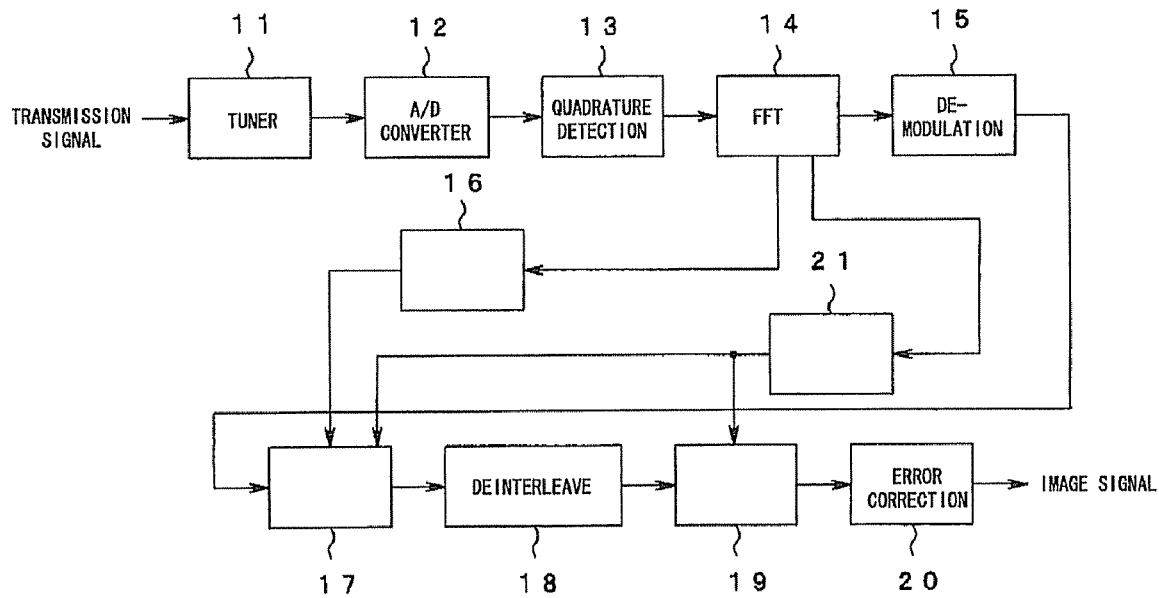
FIG. 4 is a block diagram showing a second embodiment of the present invention.

FIG. 4 is a block diagram showing a second embodiment of the present invention and is an example in which a relationship between the reliability and a converted soft-decision signal is changed according to a transmission path condition. The same configuration components in FIG. 4 as those in FIG. 1 are assigned to the same reference numerals as those in FIG. 1 and explanation thereof will be omitted.

This embodiment is different from the first embodiment in the point that a transmission path estimation circuit 21 is added and a conversion processing circuit 22 and a conversion decoding circuit 23 are used in placed of the conversion processing circuit 17 and the conversion decoding circuit 19.

The transmission path estimation circuit 21 estimates the same channel interference such as multipath, spurious or the like using an output of the FET circuit 14. The transmission path estimation circuit 21 outputs an estimation result as transmission path estimation information to the conversion processing circuit 22 and the conversion decoding circuit 23.

Figure 5:
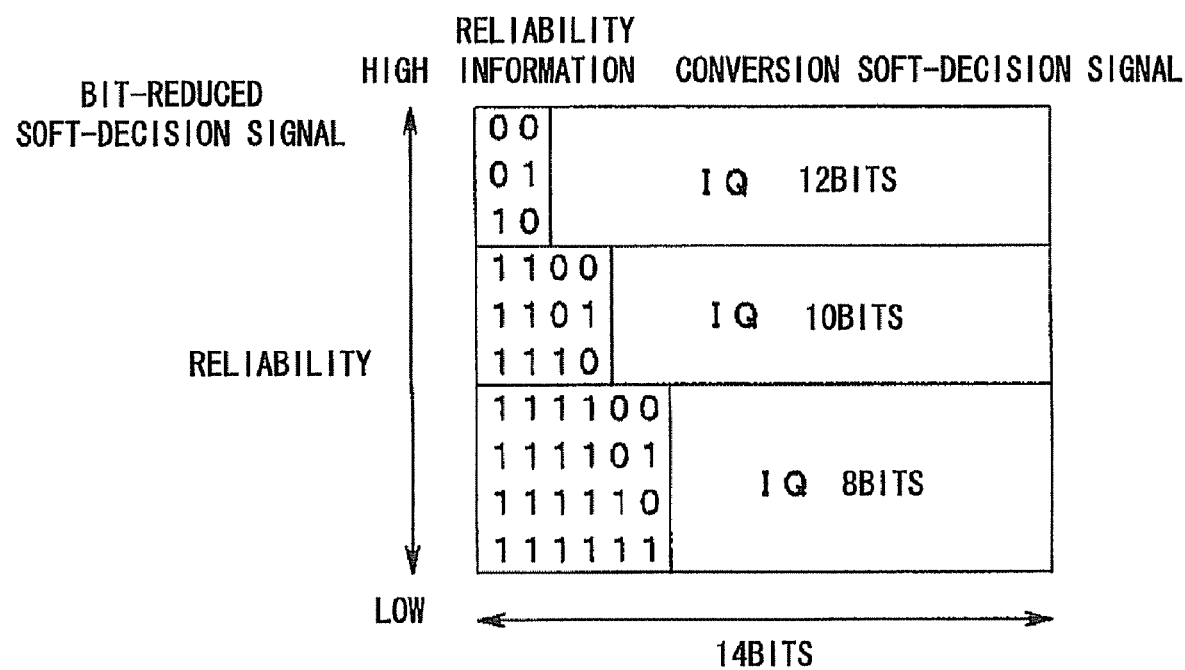
FIG. 5 is an explanatory view showing an example of a bit-reduced soft-decision signal.

Similarly to the conversion processing circuit 21, the conversion processing circuit 22 generates a converted soft-decision signal having the reduced number of bits of the soft-decision signal on the basis of the reliability information. For example, the conversion processing circuit 22 can generate a bit-reduced soft-decision signal having a converted soft-decision signal with the number of bits of two types shown in FIG. 3. Moreover, there is a case in which the converted soft-decision signal may be converted into the bit-reduced soft-decision signal with the number of bits of three types depending on the transmission condition. FIG. 5 is an explanatory view showing one example of the bit-reduced soft-decision signal in this case.

The conversion processing circuit 17 changes the relationship between the reliability and the bit-reduced soft-decision signal on the basis of transmission path estimation information from the transmission path estimation circuit 21. The conversion decoding circuit 23 decodes an output of the deinterleave circuit 18 to the soft-decision signal with the original number of bits on the basis of transmission path estimation information.

The above-configured embodiment is different from the first embodiment in only the point that the relationship between reliability and the bit-reduced soft-decision signal is changed based on transmission path estimation information from the transmission path estimation circuit 17. The transmission path estimation circuit 21 estimates a transmission condition of the transmission path from the output of the FFT circuit 14 and outputs transmission path estimation information to the conversion processing circuit 22 and the conversion decoding circuit 23. The conversion processing circuit 17 decides a bit-reduced soft-decision signal with respect to the reliability information on the basis of the transmission path estimation information.

The other function and effect are the same as those of the first embodiment.

Further, it can be considered that the reliability of the respective carriers are the same under the transmission path condition, for example, where the transmission signal has Gauss noise. Accordingly, in this case, the reliability information is unnecessary. Accordingly, the conversion processing circuit 22 may output the converted soft-decision signal as a bit-reduced soft-decision signal directly without adding the reliability information to the converted soft-decision signal on the basis of transmission path estimation information.

In this case, the conversion decoding circuit 23 grasps whether the reliability information is added to the output of the deinterleave circuit 18 on the basis of transmission path estimation information, and decodes the output of the deinterleave circuit 18 to the soft-decision signal with the original number of bits.

Thus, in this embodiment, it is possible to omit addition of the reliability information to the converted soft-decision signal. In the case where there is no need to add the reliability information, it is possible to increase the number of bits to be allocated to the converted soft-decision signal as compared with the case in which the reliability information is added. Furthermore, when the number of bits to be allocated to the converted soft-decision signal is not changed, the memory capacity used in deinterleave processing is reduced.

What is claimed is:

1. A receiving apparatus comprising:
    a demodulation means for demodulating a transmission signal to output a demodulation output having a predetermined number of bits;
    a reliability calculation means for calculating reliability of the transmission signal to output reliability information;
    a conversion processing means for dynamically allocating a number of bits of the demodulation output and the reliability information according to the reliability, and for multiplexing the demodulation output and the reliability information to output a multiplexed result; and
    a deinterleave means for deinterleaving the output of the conversion processing means,
    wherein the conversion processing means is configured to reduce a number of bits of the reliability information based on the reliability information, and to thereafter multiplex the reliability information having a reduced number of bits and the demodulated output, and
    wherein the conversion processing means is configured to reduce the number of bits of the reliability information if the reliability is high, so that a sum of the number of bits of the reliability information and a number of bits of the demodulation output is made constant.

2. The receiving apparatus according to claim 1, wherein the conversion processing means changes a quantization level of the demodulation output according to the reliability to thereby reduce the number of bits of the demodulation output.

3. The receiving apparatus according to claim 1, wherein the conversion processing means changes a relationship between the reliability information and the number of bits of the demodulation output based on a condition of a transmission path of the transmission signal.

4. The receiving apparatus according to claim 1, wherein the conversion processing means changes a relationship between the reliability information and the number of bits of the demodulation output based on a condition of a transmission path of the transmission signal.

5. The receiving apparatus according to claim 1, wherein the conversion processing means changes a relationship between the reliability information and the number of bits of the demodulation output based on a condition of a transmission path of the transmission signal.

6. The receiving apparatus according to claim 2, wherein the conversion processing means changes a relationship between the reliability information and the number of bits of the demodulation output based on a condition of a transmission path of the transmission signal.

7. The receiving apparatus according to claim 1, wherein the conversion processing means changes a relationship between the reliability information and the number of bits of the demodulation output based on a condition of a transmission path of the transmission signal.

\* \* \* \* \*